(12) United States Patent
Sechrist et al.

(10) Patent No.: US 9,711,889 B2
(45) Date of Patent: Jul. 18, 2017

(54) CABLE CONNECTOR GRID FRAME FOR A CABLE BACKPLANE SYSTEM

(71) Applicant: Tyco Electronics Corporation, Berwyn, PA (US)

(72) Inventors: Joshua Tyler Sechrist, Etters, PA (US); Jared Evan Rossman, Dover, PA (US)

(73) Assignee: TE CONNECTIVITY CORPORATION, Berwyn, PA (US)

(*) Notice: Subject to any disclaimer, the term of this patent is extended or adjusted under 35 U.S.C. 154(b) by 318 days.

(21) Appl. No.: 14/098,204

(22) Filed: Dec. 5, 2013

(65) Prior Publication Data

US 2015/0163950 A1    Jun. 11, 2015

(51) Int. Cl.

| | |
|---|---|
| *G06F 1/16* | (2006.01) |
| *H01R 13/514* | (2006.01) |
| *H05K 7/14* | (2006.01) |
| *H05K 5/00* | (2006.01) |
| *G02B 6/00* | (2006.01) |
| *H02G 3/08* | (2006.01) |
| *H02G 3/16* | (2006.01) |
| *H02G 3/18* | (2006.01) |

(52) U.S. Cl.
CPC ......... *H01R 13/514* (2013.01); *H05K 7/1449* (2013.01); *H02G 3/08* (2013.01); *H02G 3/081* (2013.01); *H02G 3/083* (2013.01); *H02G 3/16* (2013.01); *H02G 3/18* (2013.01)

(58) Field of Classification Search
CPC .......... H02G 3/08; H02G 3/081; H02G 3/083; H02G 3/16; H02G 3/18
USPC ............ 385/135; 361/679.01, 679.02, 679.4; 174/50, 135, 53, 58, 59, 60, 61, 66, 67
See application file for complete search history.

(56) References Cited

U.S. PATENT DOCUMENTS

| | | | |
|---|---|---|---|
| 7,194,181 B2 * | 3/2007 | Holmberg ............ | G02B 6/4452 385/134 |
| 2008/0096438 A1 * | 4/2008 | Clark ................... | H01R 13/518 439/713 |
| 2009/0269019 A1 * | 10/2009 | Andrus ................ | G02B 6/4452 385/135 |

* cited by examiner

*Primary Examiner* — Binh Tran

(57) ABSTRACT

A cable backplane system includes a backplane having connector openings receiving corresponding cable connectors therein and a cable tray coupled to the backplane. The cable tray has side walls surrounding a cavity defining a raceway for cables interconnecting corresponding cable connectors. A cable connector grid frame supports the cable connectors and the cable connector grid frame is loaded into the cable tray to position the cable connectors and corresponding cables in the cable tray as a unit. The cable connector grid frame includes side rails and center rails held between the side rails and forming a grid of cable connector openings between the side rails and center rails. The cable connector openings receive corresponding headers of the cable connectors and hold the positions of the headers relative to one another.

19 Claims, 11 Drawing Sheets

CABLE CONNECTOR GRID FRAME FOR A CABLE BACKPLANE SYSTEM

BACKGROUND OF THE INVENTION

The subject matter herein relates generally to a cable connector grid frame for a cable backplane system.

Communication systems, such as network systems, servers, data centers, and the like, use large printed circuit boards, known as backplanes, to interconnect midplanes, daughtercards, line cards and/or switch cards. The communication systems use high speed differential connectors mounted to the backplane and high speed differential connectors mounted to the line cards and switch cards to transmit signals therebetween. The backplane interconnects the various connectors using traces along the circuit board.

As the density of the systems increase and requirements for high speed lines increase, the printed circuit boards continue to become larger and the signal integrity inherently degrades as the signals travel further along the entire channel. At least some systems have replaced the traditional backplanes with cable assemblies. The cable assemblies need to be held in predetermined locations for mating with line and switch cards. Packaging of such cable assemblies is difficult, particularly positioning in a condensed structure. Some systems use a cable tray to support the cable connectors and cables that is connected to a backplane board for mating with the line and switch cards. Having a large number of cable connectors that need to be stacked together in the cable tray leads to many assembly problems. For example, routing of the numerous cables is complex and difficult. Loading of individual cable connectors into the cable tray with the cables from other cable connectors blocking positioning of other cable connectors makes assembly difficult.

A need remains for a cable backplane system that may be assembled in an easy and timely manner.

BRIEF DESCRIPTION OF THE INVENTION

In one embodiment, a cable backplane system is provided that includes a backplane having connector openings receiving corresponding cable connectors therein and a cable tray coupled to the backplane. The cable tray has side walls surrounding a cavity defining a raceway for cables interconnecting corresponding cable connectors. A cable connector grid frame supports the cable connectors and the cable connector grid frame is loaded into the cable tray to position the cable connectors and corresponding cables in the cable tray as a unit. The cable connector grid frame includes side rails and center rails held between the side rails and forming a grid of cable connector openings between the side rails and center rails. The cable connector openings receive corresponding headers of the cable connectors and hold the positions of the headers relative to one another.

Optionally, the cable connector grid frame may hold mutually perpendicular X, Y, and Z positions of the headers with respect to one another. The cable connector grid frame may define a rigid frame structure. The headers may be loosely held in the cable connector openings such that the headers have a limited amount of floating movement in the cable connector openings relative to the rigid frame structure.

Optionally, the side rails may hold multiple center rails defining multiple rows of cable connector openings. Each row of cable connector openings may hold a plurality of headers of cable connectors. Each header may be captured between two center rails.

Optionally, the center rails may include notches. The headers may include lugs extending therefrom that are received in corresponding notches. The notches may be oversized relative to the lugs to allow the lugs to float within the notches to allow a limited amount of floating movement of the headers relative to the cable connector grid frame. The center rails may separate two rows of cable connector openings. The notches may be sized to receive lugs from headers in both rows of cable connector openings.

Optionally, the center rails may each include a front rail and a rear rail. The headers may include lugs extending therefrom that are captured between the corresponding front rail and rear rail. The headers may be coupled to the front rail prior to the rear rail being coupled to at least one of the front rail and the side rails. The headers may be captured between the front rail and the rear rail.

Optionally, the side rails may extend along side axes. The side rails may include slots spaced apart along the side axes of the side rails. The center rails may be received in corresponding slots to hold the positions of the side rails along the side axes. The center rails may be secured to the side rails to fix positions of the center rails relative to the side rails. The center rails may be secured to the side rails by fasteners. The center rails may be secured to the side rails by tabs extending from the center rails. The center rails may be secured to the side rails by clamps.

DETAILED DESCRIPTION OF THE INVENTION

Figure 1:
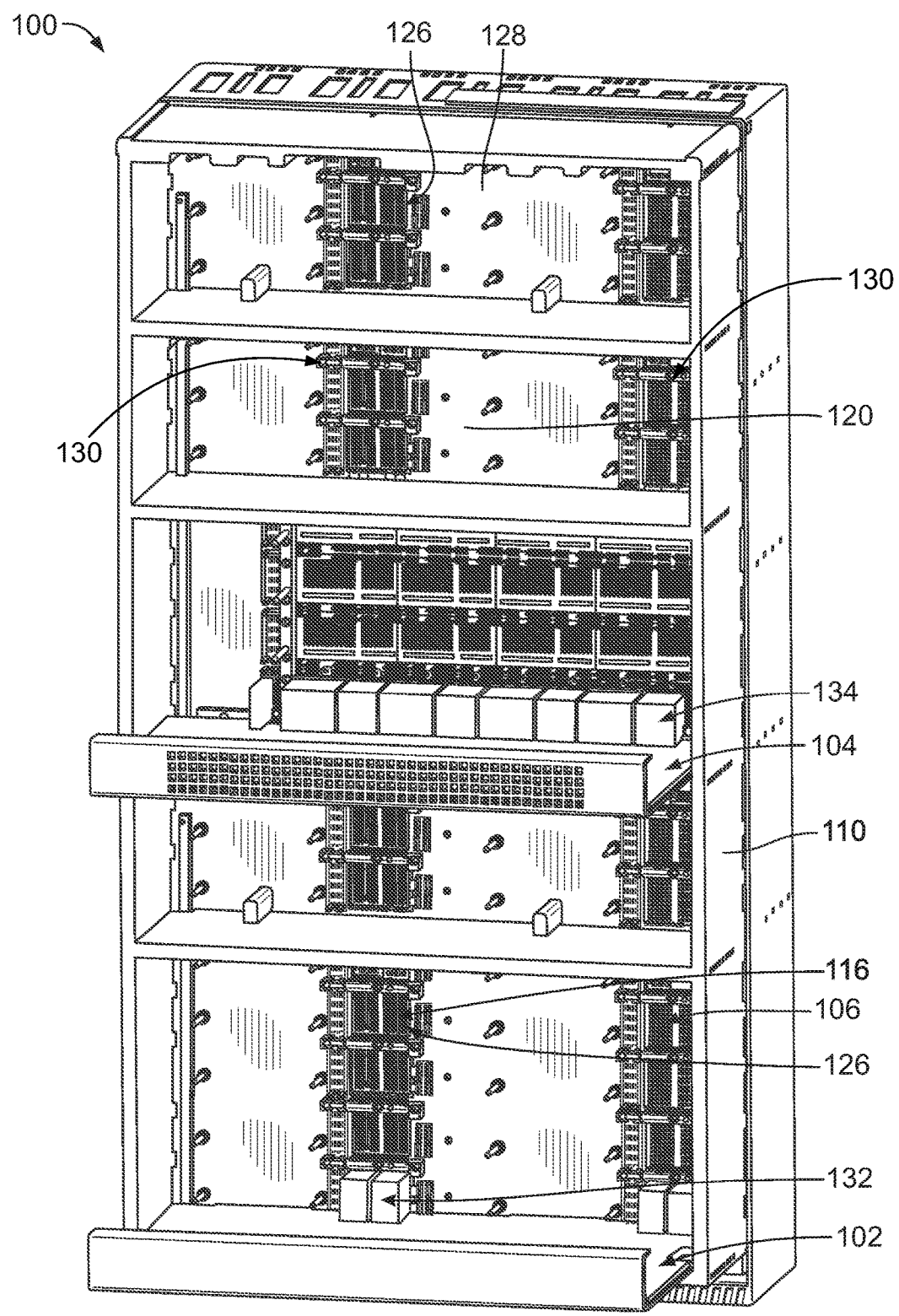
FIG. 1 is a front perspective view of a cable backplane system formed in accordance with an exemplary embodiment.
Figure 2:
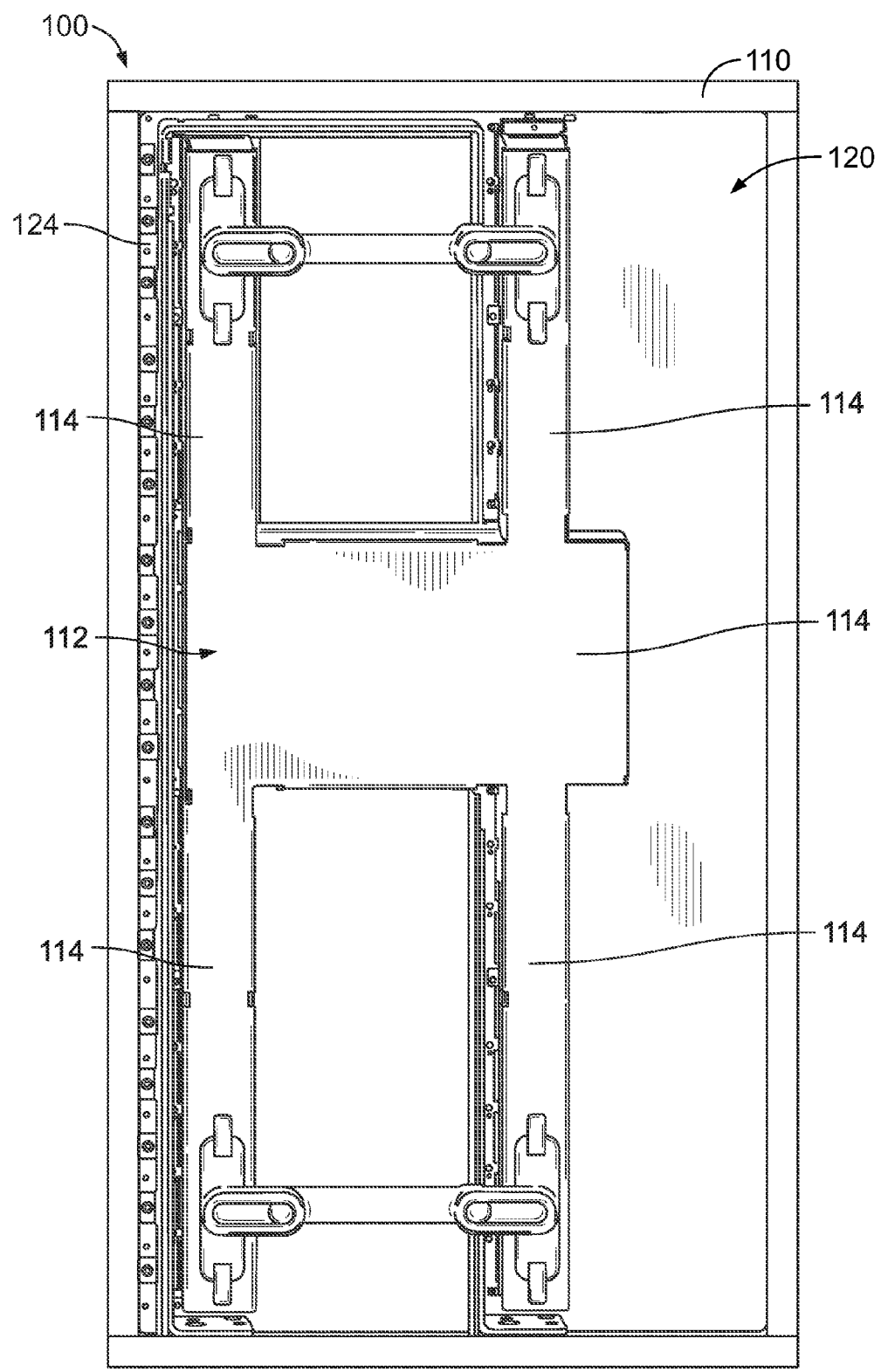
FIG. 2 is a rear perspective view of the cable backplane system.

FIG. 1 is a front perspective view of a cable backplane system 100 formed in accordance with an exemplary embodiment. FIG. 2 is a rear perspective view of the cable backplane system 100. The cable backplane system 100 is used in a data communication application, such as a network switch. The cable backplane system 100 interconnects with daughtercards, such as line cards 102 and switch cards 104 using cable connector assemblies 106. The cable backplane system 100 may be used to interconnect with other types of connectors and/or cards in other embodiments.

The cable connector assemblies 106 include cable connectors 116 that are interconnected by cables within the cable backplane system 100. The cable connector assemblies 106 eliminate interconnections via traces of a circuit board, such as a backplane circuit board. The cable connector assemblies 106 have improved signal performance along the signal paths between various connectors of the cable backplane system 100 as compared to conventional backplanes. The cable connector assemblies 106 support higher speeds, longer signal path lengths and lower cost per channel as compared to conventional backplanes. The cable connector assemblies 106 provide shielding of signal lines for improved signal performance. The cable connector assemblies 106 are packaged in a structure that allows accurate cable and connector location for mating with the corresponding line cards 102 and switch cards 104. The structure manages and organizes the many cables interconnecting the cable connectors 116.

The cable backplane system 100 includes a chassis 110 that supports the components of the cable backplane system 100. The chassis 110 may include a rack, a cabinet or other suitable structures for holding the components of the cable backplane system 100. The chassis 110 may include structures for guiding, supporting and/or securing the lines cards 102 and switch cards 104 coupled to the cable backplane system 100.

The cable backplane system 100 includes a cable rack 112 (shown in FIG. 2) that supports and/or manages the cables of the cable connector assemblies 106. The cable rack 112 includes a plurality of cable trays 114 that are held together and extend along different portions of the cable backplane system 100. The cable trays 114 may be box-shaped and define raceways for the cables. The cable rack 112 supports a plurality of the cable connectors 116 which form parts of the cable connector assemblies 106.

The cable backplane system 100 includes a backplane 120. The backplane 120 may be a circuit board and may be manufactured from typical circuit board material, such as FR-4 material. Electrical components, such as power supplies, fans, fixed connectors, and the like may be mechanically and/or electrically connected to the backplane 120. Such electrical components may be electrically connected to traces of the backplane 120. The backplane 120 may be manufactured from other materials in alternative embodiments, such as another dielectric or circuit board material or a metal material, such as a metal sheet, such as when no electrical routing on the backplane 120 is required. The cable connectors 116 are not electrically connected to the backplane 120, as is typical of conventional backplanes, but rather the cable connectors 116 are interconnected by cables extending between the cable connectors 116.

The backplane 120 and cable rack 112, with the cable connector assemblies 106, are coupled together to form the cable backplane system 100. The cable rack 112 is provided along a rear 124 of the backplane 120. The cable connectors 116 extend through connector openings 126 in the backplane 120 and are presented at a front 128 of the backplane 120 for mating with the line and switch cards 102, 104.

In an exemplary embodiment, multiple stiffeners 130 (shown in FIG. 1) are provided along the front 128 of the backplane 120. The stiffeners 130 stiffen the backplane 120 along the board areas surrounding corresponding connector openings 126 to withstand forces exerted on the backplane 120, such as pressure against the backplane 120 during assembly of the cable rack 112 to the backplane 120, mating forces when the line and switch cards 102, 104 are mated to the cable connectors 116, or other forces. The stiffeners 130 provide a structure to which the cable rack 112 may be coupled.

In an exemplary embodiment, the cable rack 112 is flexible to allow the cable connectors 116 to align with and pass through the connector openings 126. For example the cable trays 114 may be shifted or moved into position with respect to the backplane 120. Optionally, portions of the cable trays 114 may pass through the connector openings 126 with the cable connectors 116. The cable trays 114 may float relative to each other to properly align the cable connectors 116 with the corresponding connector openings 126. In an exemplary embodiment, the cable connectors 116 float relative to one another and relative to the cable trays 114 to allow precise positioning of the cable connectors 116 between the stiffeners 130 for mating with the line and/or switch cards 102, 104. The backplane 120 and stiffeners 130 hold the cable connectors 116 in precise locations for mating with the line and/or switch cards 102, 104. The backplane 120 and stiffeners 130 have tight tolerances to control mating with the line and switch cards 102, 104.

The line and switch cards 102, 104 have card connectors 132, 134, respectively, that mate with corresponding cable connectors 116. The cable connectors 116 need to be precisely positioned relative to the backplane 120 for mating with corresponding card connectors 132, 134. The stiffeners 130 position the cable connectors 116 for mating with the card connectors 132, 134. In an exemplary embodiment, the stiffeners 130 guide the card connectors 132, 134 into proper position for mating with the cable connectors 116.

Figure 3:
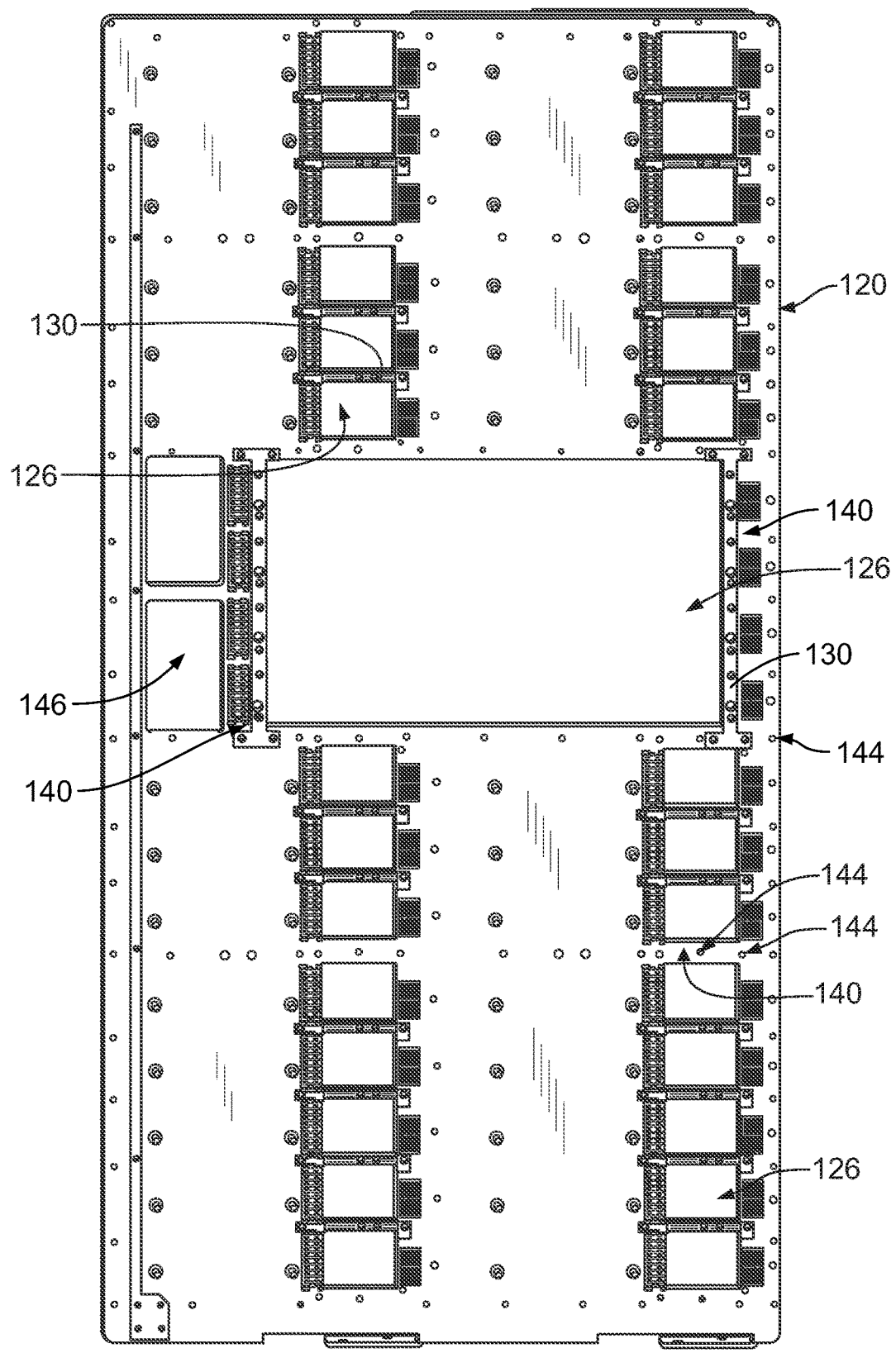
FIG. 3 illustrates a backplane of the cable backplane system and formed in accordance with an exemplary embodiment.

FIG. 3 illustrates the backplane 120 formed in accordance with an exemplary embodiment. The backplane 120 includes the connector openings 126 that receive the cable connectors 116 (shown in FIG. 1) and/or portions of the cable trays 114 (shown in FIG. 2). The connector openings 126 may be single openings that receive single cable connectors 116 or a few cable connectors 116, such as the cable connectors 116 associated with the line cards 102 (shown in FIG. 1). The connector openings 126 may be large openings that receive many cable connectors 116, such as the cable connectors 116 associated with the switch cards 104 (shown in FIG. 1).

The backplane 120 includes board areas 140 surrounding the connector openings 126. The board areas 140 provide a mounting location for the stiffeners 130. Optionally, stiffeners 130 may be provided adjacent each connector opening 126. The stiffeners 130 are rigid and may stiffen the structure of the backplane 120. For example, because many holes or openings are provided in the structure of the backplane 120, such as to receive the cable connectors 116 (shown in FIG. 1) or other components, such as power components, airflow system components and the like, the stiffeners 130 add structural strength and rigidity to the backplane 120. The stiffeners 130 may be metal stiffeners separately fabricated from the backplane 120 and attached to the backplane 120.

The backplane 120 includes holes 144 therethrough that receive guide features, fasteners or other components used to assemble the cable backplane system 100. The holes 144 may define guide holes (which may be referred to hereinafter as guide holes 144) that receive guide features such as guide pins. The holes 144 may define threaded holes that receive threaded fasteners to secure the stiffeners 130, the cable rack 112 (shown in FIG. 2), or other components to the backplane 120. The backplane 120 may include component openings 146 therethrough that receive other electrical components, such as power supplies, airflow components, and the like, that are attached to the backplane 120. Some electrical components may be surface mounted to the backplane 120. Optionally, some electrical connectors may be terminated and fixed to the backplane 120, such as through-hole mounting to plated vias of the backplane 120 that are electrically connected to conductive traces on layers of the backplane 120. The electrical connectors may be mounted in the board areas 140 near the connector openings 126 that receive the cable connectors 116 (shown in FIG. 1).

Figure 4:
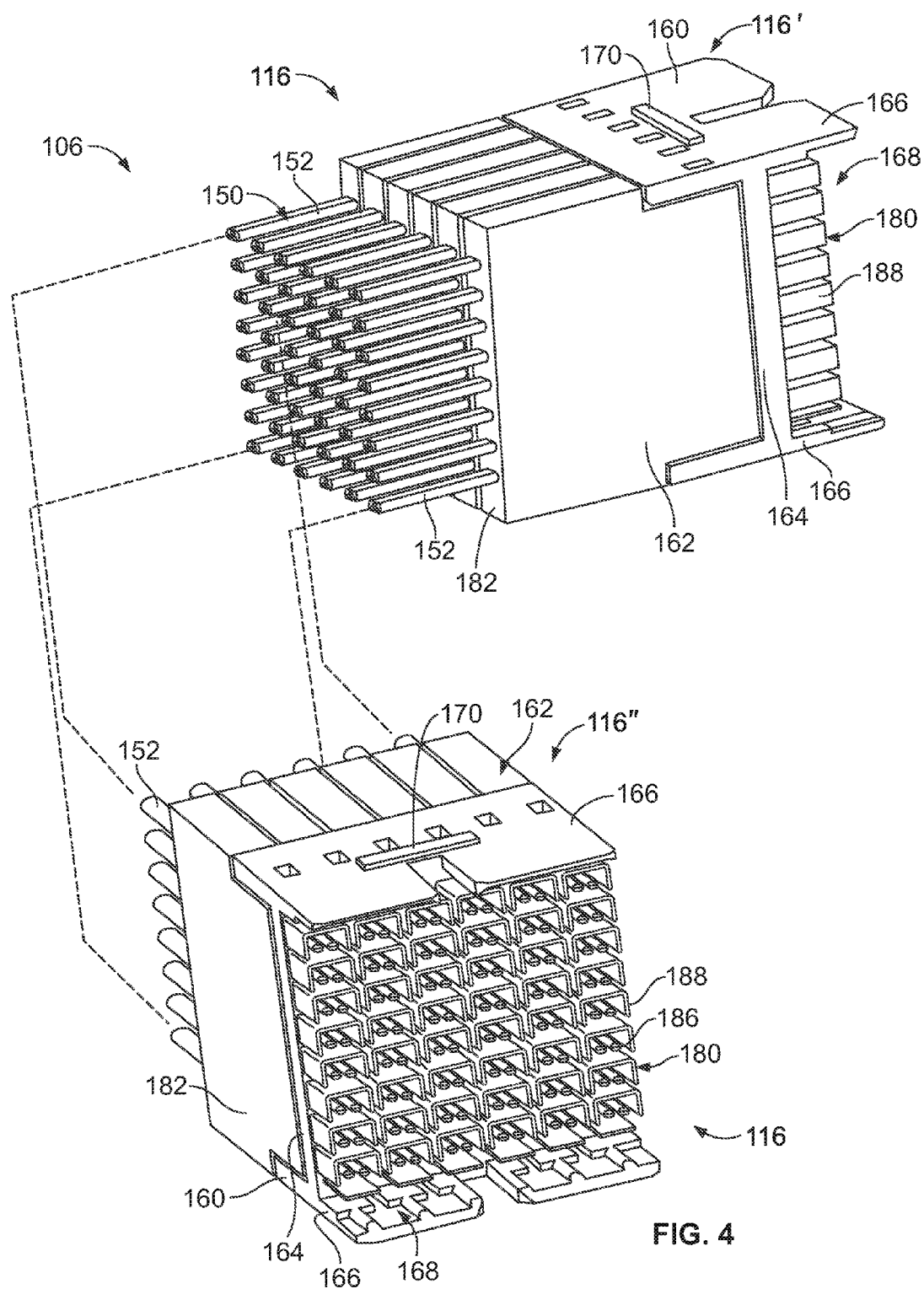
FIG. 4 illustrates a cable connector assembly of the cable backplane system and formed in accordance with an exemplary embodiment.

FIG. 4 illustrates a cable connector assembly 106 formed in accordance with an exemplary embodiment. The cable connector assembly 106 includes a plurality of the cable connectors 116, which may be referred to hereinafter as first and second cable connectors 116', 116", and a cable bundle 150 between the cable connectors 116. The cable connectors 116 are provided at ends of the cable bundle 150. The cable bundle 150 includes a plurality of cables 152. Optionally, the first cable connector 116' may be connected to a card connector 132 (shown in FIG. 1) of a line card 102 (shown in FIG. 1) and the second cable connector 116" may be connected to a card connector 134 (shown in FIG. 1) of the switch card 104 (shown in FIG. 1).

Optionally, the cable connectors 116 may be identical to one another. The cable connectors 116 may define header connectors. The cable connectors 116 are configured to be mated with corresponding card connectors 132, 134, which may be receptacle connectors, such as STRADA Whisper receptacle connectors, commercially available from TE Connectivity, Harrisburg, Pa. In an exemplary embodiment, the cable connector 116 is a high speed differential pair cable connector that includes a plurality of differential pairs of conductors mated at a common mating interface. The differential conductors are shielded along the signal paths thereof to reduce noise, crosstalk and other interference along the signal paths of the differential pairs.

In an exemplary embodiment, the cables 152 are twin axial cables having two signal wires within a common jacket of the cable 152. The signal wires convey differential signals. In an exemplary embodiment, the signal wires are shielded, such as with a cable braid of the cable 152. Optionally, each of the signal wires may be individually shielded. Other types of cables 152 may be provided in alternative embodiments. For example, coaxial cables may extend from the cable connector 116 each carrying a single signal conductor therein.

The cable connector 116 includes a header 160 holding a plurality of contact modules 162. The header 160 includes a base wall 164 and shroud walls 166 extending from the base wall 164 to define a mating cavity 168 configured to receive the corresponding card connector 132, 134. The shroud walls 166 guide mating of the card connector 132, 134 with the cable connector 116. In an exemplary embodiment, the header 160 has lugs 170 extending outward from the shroud walls 166. The lugs 170 are used to locate the cable connector 116 with respect to the corresponding cable tray 114 (shown in FIG. 2).

Each of the contact modules 162 includes a plurality of cable assemblies 180 held by a support body 182. Each cable assembly 180 includes a pair of signal contacts 186 terminated to corresponding signals wires of the cable 152. Each cable assembly 180 also includes a ground shield 188 providing shielding for the signal contacts 186. In an exemplary embodiment, the ground shield 188 peripherally surrounds the signal contacts 186 along the entire length of the signal contacts 186 to ensure that the signal paths are electrically shielded from interference. The cable assemblies 180 may be provided with greater or fewer signal contacts 186 in alternative embodiments. The cable assemblies 180 may be provided without the ground shields 188 in alternative embodiments. The cable assemblies 180 may be provided with different shaped ground shields 188 in alternative embodiments.

The support body 182 provides support for the cable assemblies 180. The cables 152 extend into the support body 182 such that the support body 182 supports a portion of the cables 152. The support body 182 may provide strain relief for the cables 152. Optionally, the support body 182 may be manufactured from a plastic material. Alternatively, the support body 182 may be manufactured from a metal material. The support body 182 may be a metalized plastic material to provide additional shielding for the cables 152 and the cable assemblies 180. Optionally, the support body 182 may include a metal plate electrically connected to each ground shield 188 to electrically common the ground shields 188, and a dielectric overmold overmolded around the cables 152 and portions of the metal plate to support the cables 152 and cable assemblies 180. The contact modules 162 may be provided without the support bodies 182 in alternative embodiments.

Multiple contact modules 162 are loaded into the header 160. The header 160 holds the contact modules 162 in parallel such that the cable assemblies 180 are aligned in parallel columns. Any number of contact modules 162 may be held by the header 160 depending on the particular application. When the contact modules 162 are stacked in the header 160, the cable assemblies 180 may also be aligned in rows.

Figure 5:
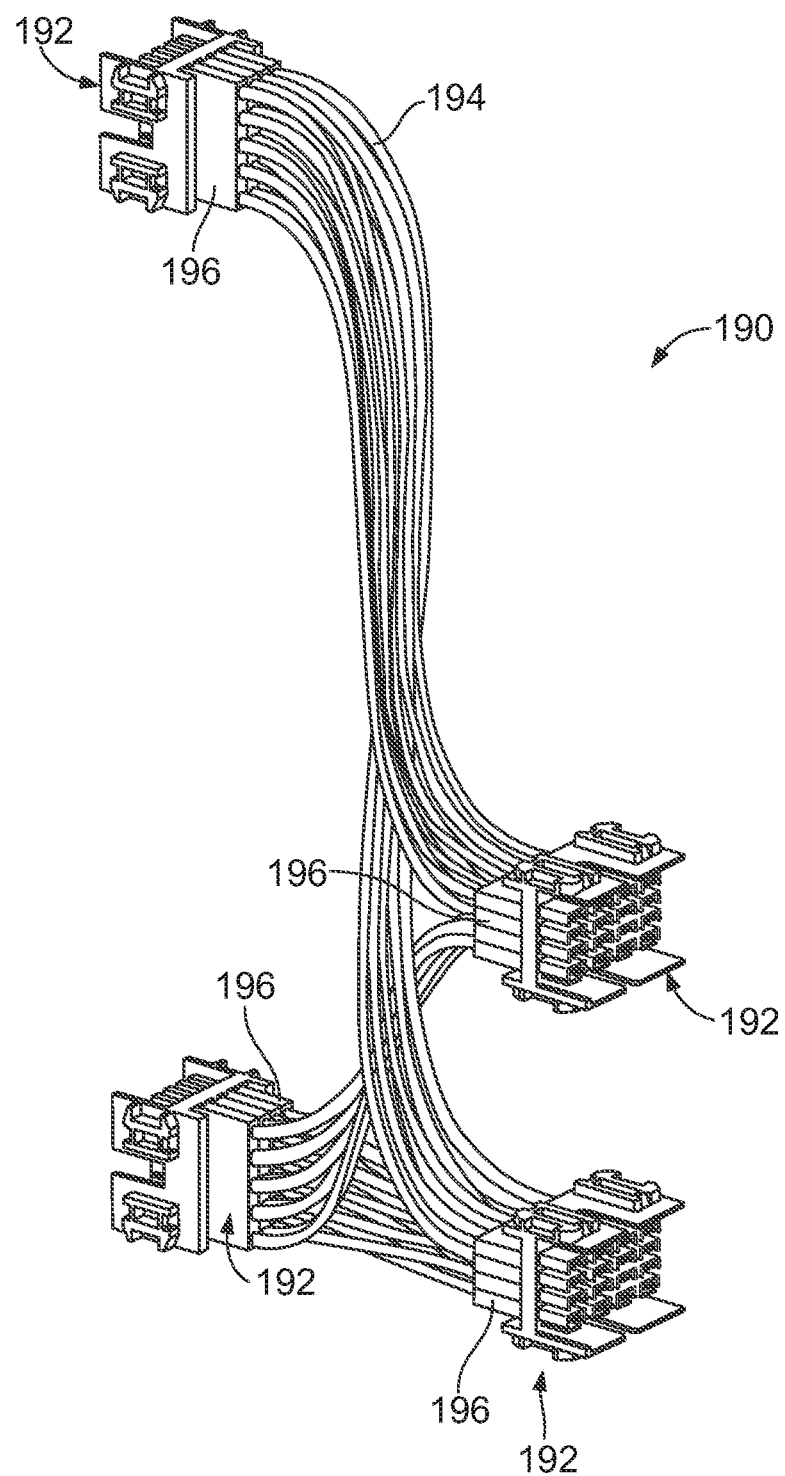
FIG. 5 illustrates a cable connector assembly formed in accordance with an exemplary embodiment.

FIG. 5 illustrates a cable connector assembly 190 formed in accordance with an exemplary embodiment. The cable connector assembly 190 is similar to the cable connector assembly 106 (shown in FIG. 4); however the cable connector assembly 190 includes more cable connectors 192 (e.g. four cable connectors 192 are shown in the embodiment illustrated in FIG. 5). Some of the cable connectors 192 may be used to interconnect with receptacle or card connectors 134 associated with the switch card 104 (both shown in FIG. 1), such as the bottom two cable connectors 192, while other cable connectors 192 may be used to interconnect with receptacle or card connectors 132 associated with the line card 102 (both shown in FIG. 1). Optionally, cables 194 from the same cable connector 192, such as cables from different contact modules 196, may be routed to several other cable connectors 192.

Figure 6:
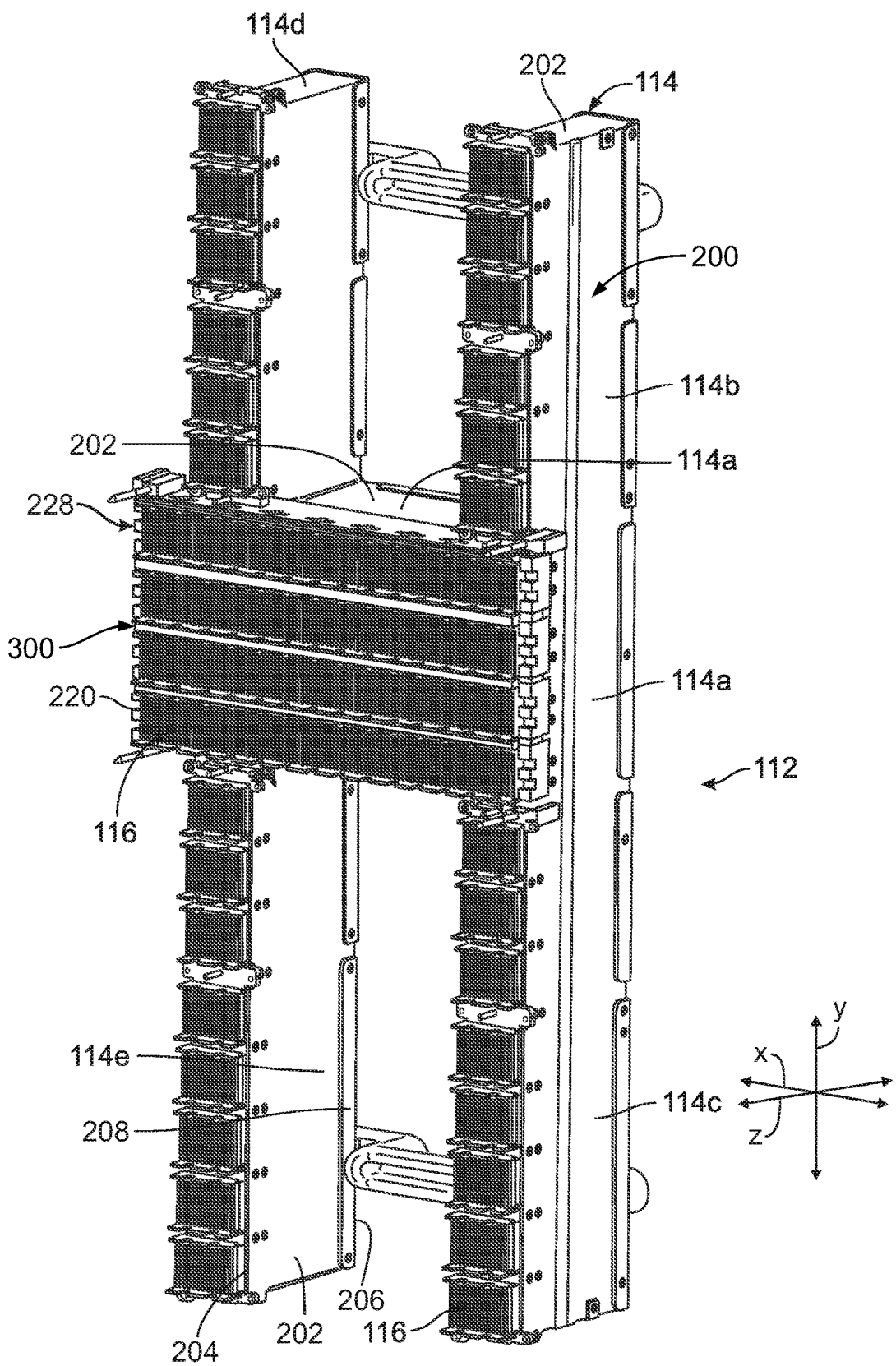
FIG. 6 is a front perspective view of a cable rack of the cable backplane system.
Figure 7:
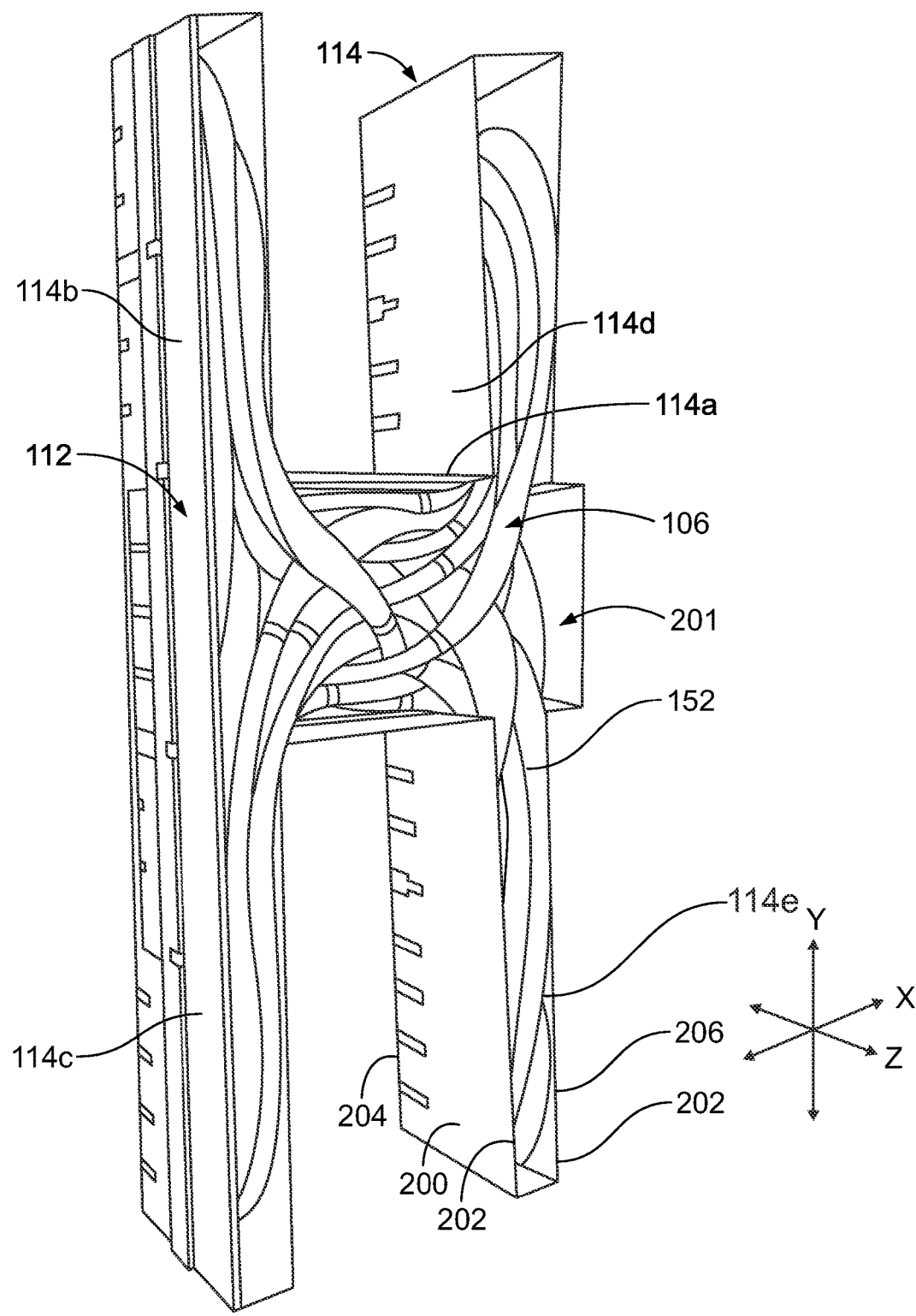
FIG. 7 is a rear perspective view of a portion of the cable rack.

FIG. 6 is a front perspective view of the cable rack 112 with the cable connector assemblies 106 held therein. FIG. 7 is a rear perspective view of a portion of the cable rack 112. The cable rack 112 includes one or more cable trays 114 connected together to form the cable rack 112. In the illustrated embodiment, the cable rack 112 includes five cable trays 114a, 114b, 114c, 114d and 114e; however any number of cable trays 114 may be used in alternative embodiments. The cable trays 114 are coupled together into an H-shaped configuration having the first cable tray 114a at a central location with the other cable trays 114b, 114c, 114d, 114e extending outward from the first cable tray 114a as legs. The cable rack 112 may have other shapes in alternative embodiments. The cable rack 112 includes a cable connector grid frame 300 used to hold multiple headers 160 (shown in FIG. 4) of the cable connectors 116 together as a unit that can be loaded into one or more cable trays 114 at one time. The cable connector grid frame 300 positions the headers 160 relative to one another to make routing and organizing of the cables 152 (shown in FIG. 7) into the cable tray(s) 114 easier for the assembler.

In an exemplary embodiment, the first cable tray 114a is used to hold the cable connectors 116 that are mated with the card connectors 134 of the switch cards 104 (both shown in FIG. 1). The cable connectors 116 in the first cable tray 114a may be held together as one or more bricks 228 in the cable connector grid frame 300 prior to loading such cable connectors 116 into the first cable tray 114a. The cable connectors 116 of each brick 228 are connected to the card connectors 134 of the same switch card 104. The other cable trays 114b, 114c, 114d, 114e are used to hold the cable connectors 116 that are mated with the card connectors 132 of the line cards 102 (both shown in FIG. 1). The cable connectors 116 loaded into the cable trays 114b, 114c, 114d, 114e may be held together by the same cable connector grid frame 300 as the cable connectors 116 loaded into the first cable tray 114a, or may be held in one or more different cable connector grid frames 300. Optionally, the cable connectors 116 aligned at the same vertical position but in different cable trays (e.g. 114b and 114d or 114c and 114e) are connected to the card connectors 132 of the same line card 102.

Each cable tray 114 includes a frame 200 surrounding a cavity 201 that defines a raceway through which the cables 152 are routed. The raceways are open to one another to allow the cables 152 to be routed from one cable tray 114 into another cable tray 114. The frame 200 includes side walls 202 extending between a front edge 204 and a rear 206 of the cable tray 114. A back wall 208 (shown in FIG. 6, but removed for clarity in FIG. 7 to illustrate the cables 152 routed in the cavities 201) covers the raceway at the rear 206. The frame 200 is open at the front edge 204 between the side walls 202. The cable connector grid frame(s) 300, while holding the plurality of cable connectors 116, is loaded into the cable tray(s) 114, such as through the rear 206, or alternatively, through the front. Once the cable connector grid frame 300 is positioned in the corresponding tray 114, the cable connectors 116 are positioned at or forward of the front edge 204 for loading into the backplane 120 (shown in FIG. 3).

In an exemplary embodiment, the side walls 202 and back wall 208 are sheet metal pieces that are stamped, formed and coupled together, such as using fasteners or other connecting means. The sheet metal may be thin enough to allow the frame 200 to have some flexibility for moving, twisting or otherwise manipulating the cable trays 114 into position relative to the backplane 120 to position the cable connectors 116 in the connector openings 126 (shown in FIG. 3) in the backplane 120. Optionally, the cable trays 114 may be connected to each other with some freedom of movement or float in the connection to allow the cable trays 114 to move relative to one another to properly align the cable connectors 116 with the connector openings 126 in the backplane 120.

In an exemplary embodiment, the cable connectors 116 are movable relative to the cable connector grid frame 300 to allow the cable connectors 116 to align with the corresponding connector openings 126 during assembly of the cable rack 112 and backplane 120. For example, the cable connector grid frame 300 may allow a limited amount of movement or float in mutually perpendicular X, Y and/or Z directions to allow fine alignment of the cable connectors 116 with the connector openings 126. In an exemplary embodiment, the cable connectors 116 are configured to float within the connector openings 126 relative to the cable connector grid frame 300 and/or cable trays 114 to obtain a true position for aligning to and mating with the corresponding card connectors 132, 134.

Figure 8:
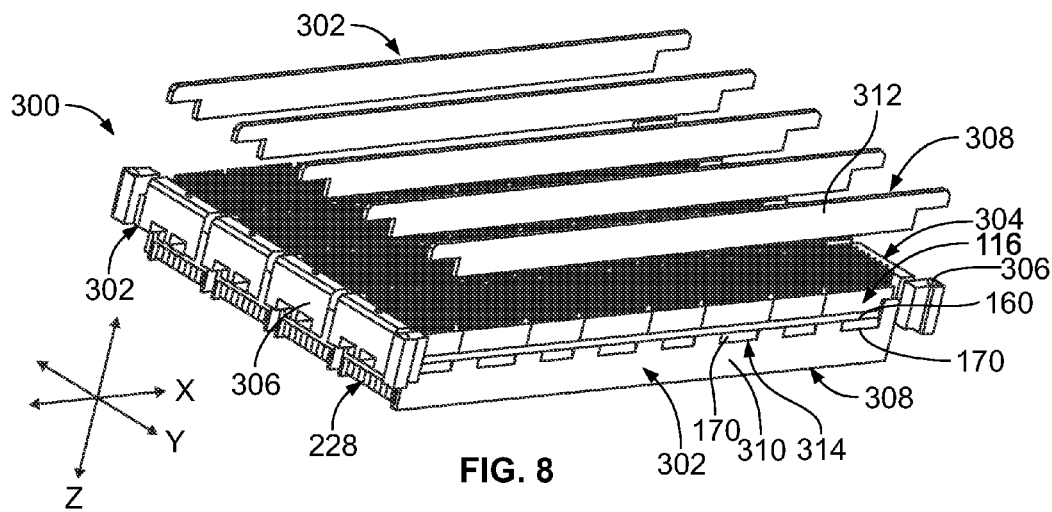
FIG. 8 is a partially assembled, rear perspective view of a cable connector grid frame for the cable rack.

FIG. 8 is a partially assembled, rear perspective view of the cable connector grid frame 300 supporting a plurality of cable connectors 116. The cable connector grid frame 300 includes a plurality of rails 302 that form cable connector openings 304 that receive corresponding headers 160 of the cable connectors 116. The rails 302 hold the positions of the headers 160 relative to one another. Optionally, the cable connector grid frame 300 holds mutually perpendicular X, Y, and Z positions of the headers 160 with respect to one another. The cable connector grid frame 300 forms a rigid frame structure, where the rails 302 are fixed relative to one another. The headers 160 may be loosely held in the cable connector openings 304 such that the headers 160 have a limited amount of floating movement in the cable connector openings 304 relative to the rigid frame structure. The cable connector grid frame 300 and cable connectors 116 may then be loaded into the corresponding cable tray(s) 114 (shown in FIGS. 6 and 7) as a unit.

In an exemplary embodiment, the rails 302 include both side rails 306 and center rails 308. The center rails 308 extend between the side rails 306. The side rails 306 hold the positions of the center rails 308 relative to one another. Optionally, the center rails 308 include both front rails 310 and rear rails 312. The headers 160 are captured between the front and rear rails 310, 312. The center rails 308 are held between the side rails 306 and form a grid of cable connector openings 304 between the side rails 306 and center rails 308. Each header 160 is captured between and flanked by two center rails 308. In an exemplary embodiment, the side rails 306 hold multiple center rails 308 therebetween, defining multiple rows of cable connector openings 304. For example, in the illustrated embodiment, five center rails 308 are provided defining four cable connector openings 304. Each row of cable connector openings 304 holds a plurality of headers 160 of cable connectors 116 to define corresponding bricks 228 (also shown in FIG. 6).

In an exemplary embodiment, the center rails 308 include notches 314 that receive lugs 170 of corresponding headers 160. In the illustrated embodiment, the notches 314 are formed in the front rails 310; however the notches 314 may additionally or alternatively be formed in the rear rails 312. Optionally, the center rails 308 that separate two rows of cable connector openings 304 may be thicker than the center rails 308 at ends of the grid frame 300 to accommodate and receive lugs 170 from headers 160 in both rows of cable connector openings 304.

In an exemplary embodiment, the notches 314 are oversized relative to the lugs 170 to allow the lugs 170 to float within the notches 314 to allow a limited amount of floating movement of the headers 160 relative to the cable connector grid frame 300. The size of the notches 314 and the spacing between the center rails 308 may be controlled to have a predetermined amount of floating movement of the headers 160 in mutually perpendicular X, Y and Z directions. When the rear rail 312 is coupled to the front rail 310 and/or the side rails 306, the lugs 170 are captured between the front and rear rails 310, 312. For example, the front and rear rails 310, 312 may limit forward and backward movement (in the Z direction) of the headers 160.

Figure 9:
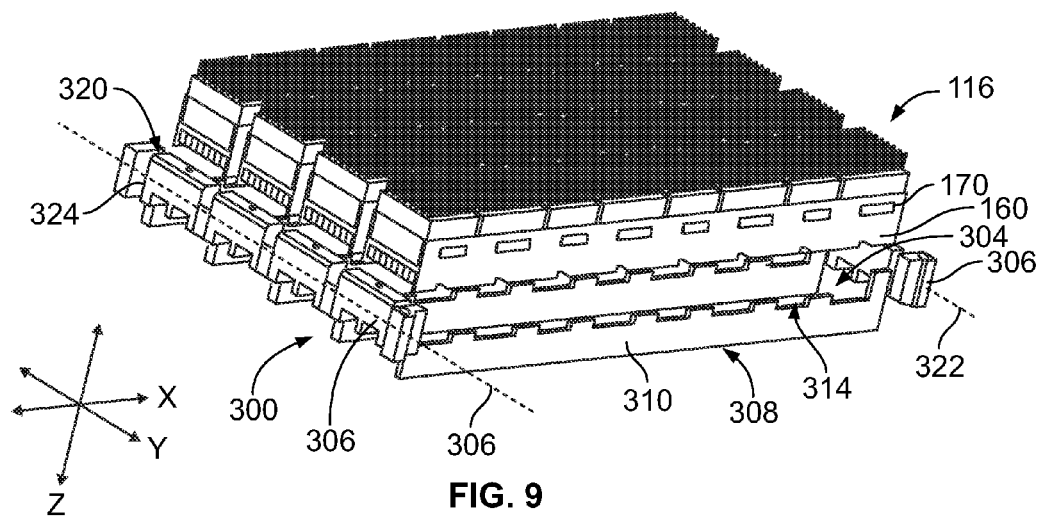
FIG. 9 is a partially assembled, rear perspective view of the cable connector grid frame.

FIG. 9 is a partially assembled, rear perspective view of the cable connector grid frame 300 and corresponding cable connectors 116. The cable connectors 116 are shown poised for loading into the cable connector grid frame 300. The side rails 306 include slots 320 spaced apart along side axes 322 of the side rails 306. The side axes 322 extend in the Y direction. Optionally, when the cable connector grid frame 300 is assembled in the cable tray(s) 114 (shown in FIGS. 6 and 7), the cable connector grid frame 300 may be oriented such that the side axes 322 (Y direction) are oriented vertically. The front rail 310 includes tabs 324 (also shown in FIG. 10) at opposite ends of the front rail 310 that are received in corresponding slots 320. The tabs 324 secure the front rail 310 to the side rails 306.

During assembly, the front rails 310 are coupled to the side rails 306 to form the general structure of the cable connector grid frame 300 and cable connector openings 304. The front rails 310 are secured to the side rails 306 to fix positions of the center rails 308 relative to the side rails 306. The cable connectors 116 are loaded into the cable connector openings 304 from the rear. The headers 160 are positioned between corresponding front rails 310 in the cable connector openings 304. The lugs 170 are loaded into the notches 314 to position the headers 160 side-to-side (X direction). The rear rails 312 (shown in FIG. 8) are assembled later to capture the cable connectors 116 in the cable connector grid frame 300 and hold the front-to-back (Z direction) positions of the cable connectors 116.

Figure 10:
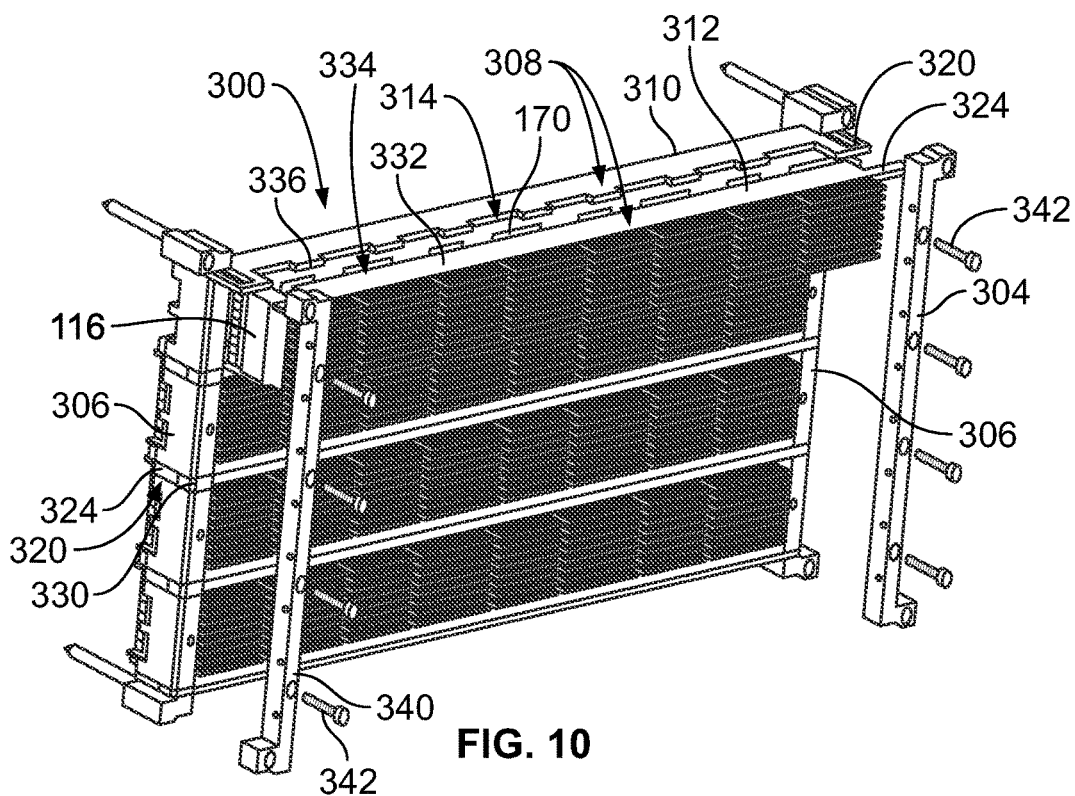
FIG. 10 is a partially assembled, rear perspective view of the cable connector grid frame.

FIG. 10 is a partially assembled, rear perspective view of the cable connector grid frame 300 and corresponding cable connectors 116. One of the front rails 310 is shown poised for coupling to the side rails 306. The tabs 324 are aligned with the slots 320 and the front rail 310 is then loaded into position. One of the rear rails 312 is shown poised for coupling to the side rails 306 and front rail 310. The rear rail 312 includes tabs 330 configured to be received in the slots 320. The rear rail 312 includes a stuffer plate 332 loaded into the front rail 310 between the tabs 324 thereof. The stuffer plate 332 includes a front edge 334 that engages fingers 336 of the front rail 310 between the notches 314. The front edge 334 closes off the open, rear side of the notches 314 to capture the lugs 170 in the notches 314.

In an exemplary embodiment, clamps 340 are used to secure the rear rail 312 to the side rails 306. The clamps 340 are coupled to the rear of the side rails 306 to capture the center rails 308 in the slots 320. For example, the tabs 324, 330 are held in the slots 320 by the clamps 340. The clamps 340 may be secured to the side rails 306 by fasteners 342, which may be threaded fasteners.

Figure 11:
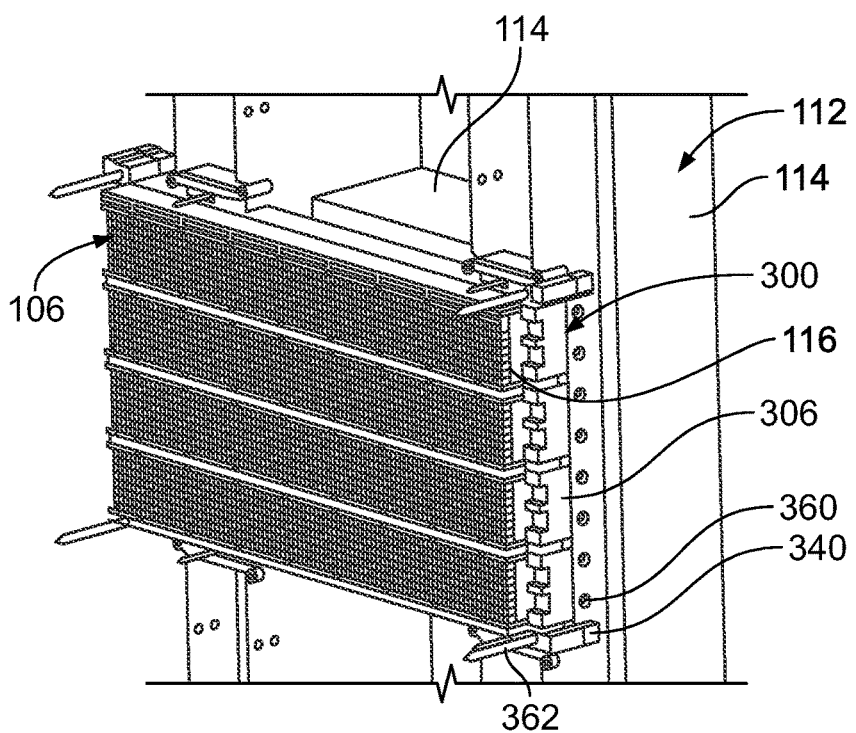
FIG. 11 is a front perspective view of the cable connector grid frame and corresponding cable connectors loaded in a cable tray of the cable rack.

FIG. 11 is a front perspective view of the cable connector grid frame 300 and corresponding cable connectors 116 loaded in the cable tray 114. Optionally, the cable connector grid frame 300 and cable connectors 116 may be loaded into the cable tray 114 through the front thereof. The cables 152 (shown in FIG. 7) may be routed in the corresponding trays 114 and the other ends of the cable connector assemblies 106 may be either coupled directly to the tray 114 using spacers or other supports and/or may be pre-assembled into one or more cable connector grid frames that are coupled to the cable trays 114 with the cable connector grid frame 300.

Fasteners 360 are used to secure the cable connector grid frame 300 to the cable tray 114. For example, the fasteners 360 may be secured to the side rails 306 and/or the clamps 340 (also shown in FIG. 10). Guide pins 362 extend forward of the side rails 306 for locating the cable rack 112 to the backplane 120 (shown in FIG. 3).

Figure 12:
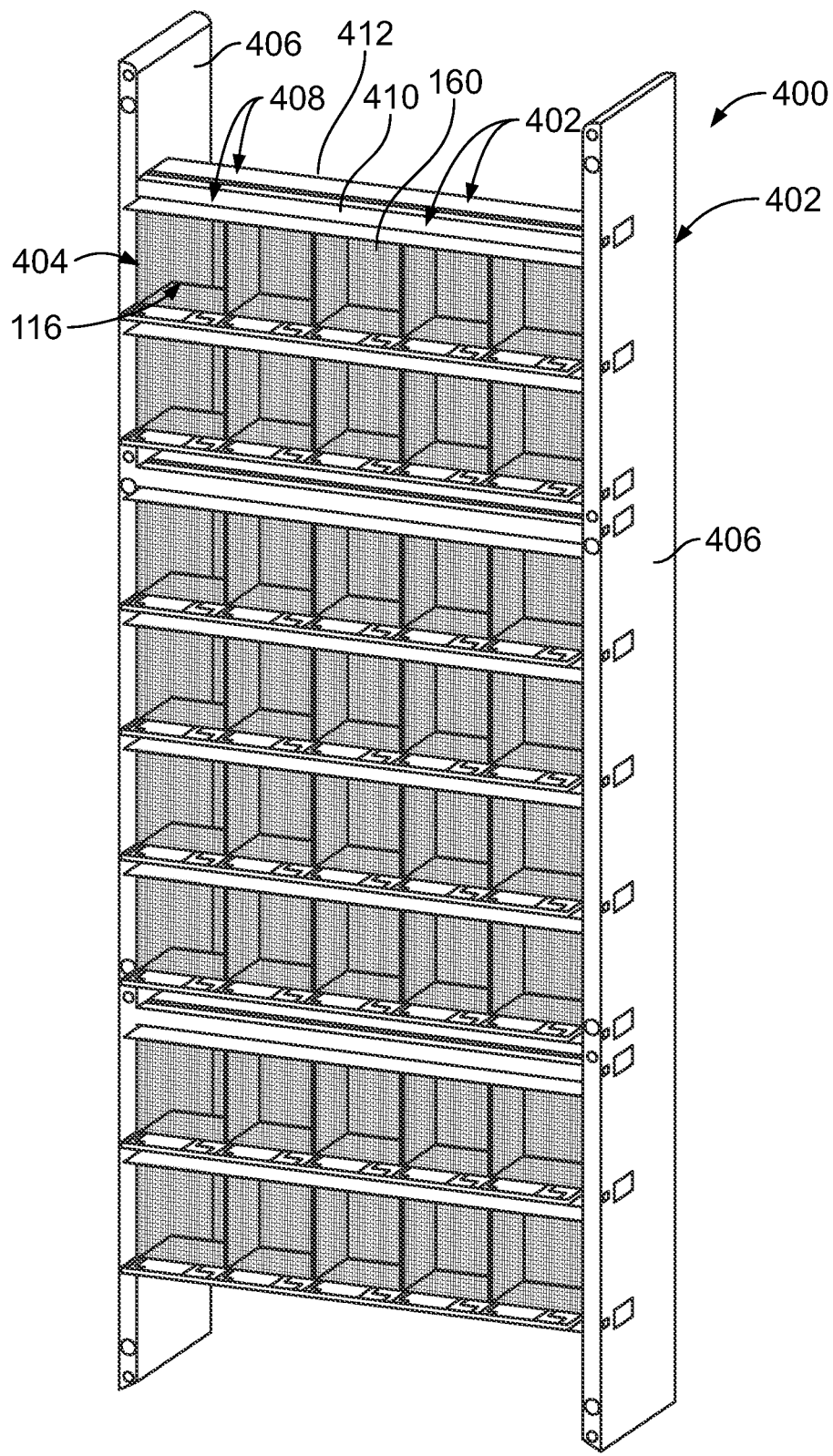
FIG. 12 is a front perspective view of a cable connector grid frame formed in accordance with an exemplary embodiment.

FIG. 12 is a front perspective view of a cable connector grid frame 400 formed in accordance with an exemplary embodiment. The cable connector grid frame 400 has a different arrangement of cable connectors 116 than the cable connector grid frame 300 (shown in FIG. 11). The cable connector grid frame 400 includes different structural components for supporting the cable connectors 116 than the cable connector grid frame 300. The cable connector grid frame 400 may be received in a cable tray (not shown) that has a different shape than the cable tray 114 (shown in FIGS. 6 and 7).

The cable connector grid frame 400 includes a plurality of rails 402 that form cable connector openings 404 that receive corresponding headers 160 of the cable connectors 116. The rails 402 hold the positions of the headers 160 relative to one another. The headers 160 may be loosely held in the cable connector openings 404 such that the headers 160 have a limited amount of floating movement in the cable connector openings 404 relative to the rigid frame structure.

In an exemplary embodiment, the rails 402 include both side rails 406 and center rails 408. The center rails 408 extend between the side rails 406. The side rails 406 hold the positions of the center rails 408 relative to one another. Optionally, the center rails 408 include both front rails 410 and rear rails 412. The headers 160 are captured between the front and rear rails 410, 412.

Figure 13:
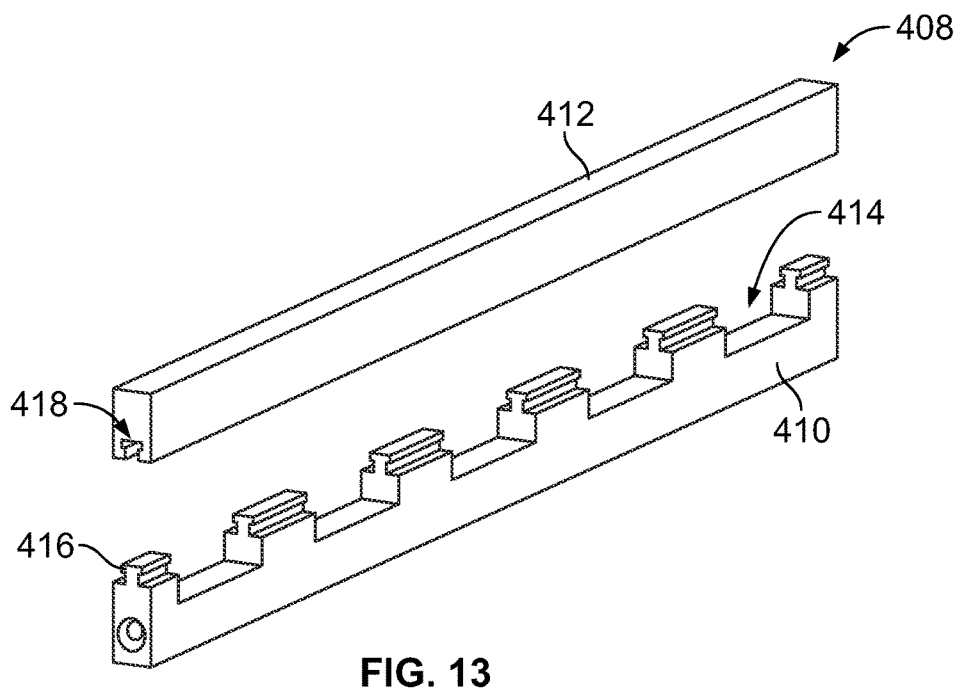
FIG. 13 illustrates a center rail of the cable connector grid frame shown in FIG. 12.

FIG. 13 illustrates one of the center rails 408 showing the front and rear rails 410, 412. The front rail 410 include notches 414 that receive lugs 170 (shown in FIG. 4) of corresponding headers 160 (shown in FIG. 12). The notches 414 may additionally or alternatively be formed in the rear rails 412. In an exemplary embodiment, the notches 414 are oversized relative to the lugs 170 to allow the lugs 170 to float within the notches 414 to allow a limited amount of floating movement of the headers 160 relative to the cable connector grid frame 400.

The front rail 410 includes mounting ears 416 along the rear edge thereof. The rear rail 412 is secure to the mounting ears 416 when assembled. The mounting ears 416 define a dovetail. The mounting ears 416 may be T-shaped.

The rear rail 412 includes a track 418 at a front thereof. The track 418 receives the mounting ears 416. The track 418 has a complementary shape to the mounting ears 416. The rear rail 412 is slid onto the front rail 410 from the side.

Figure 14:
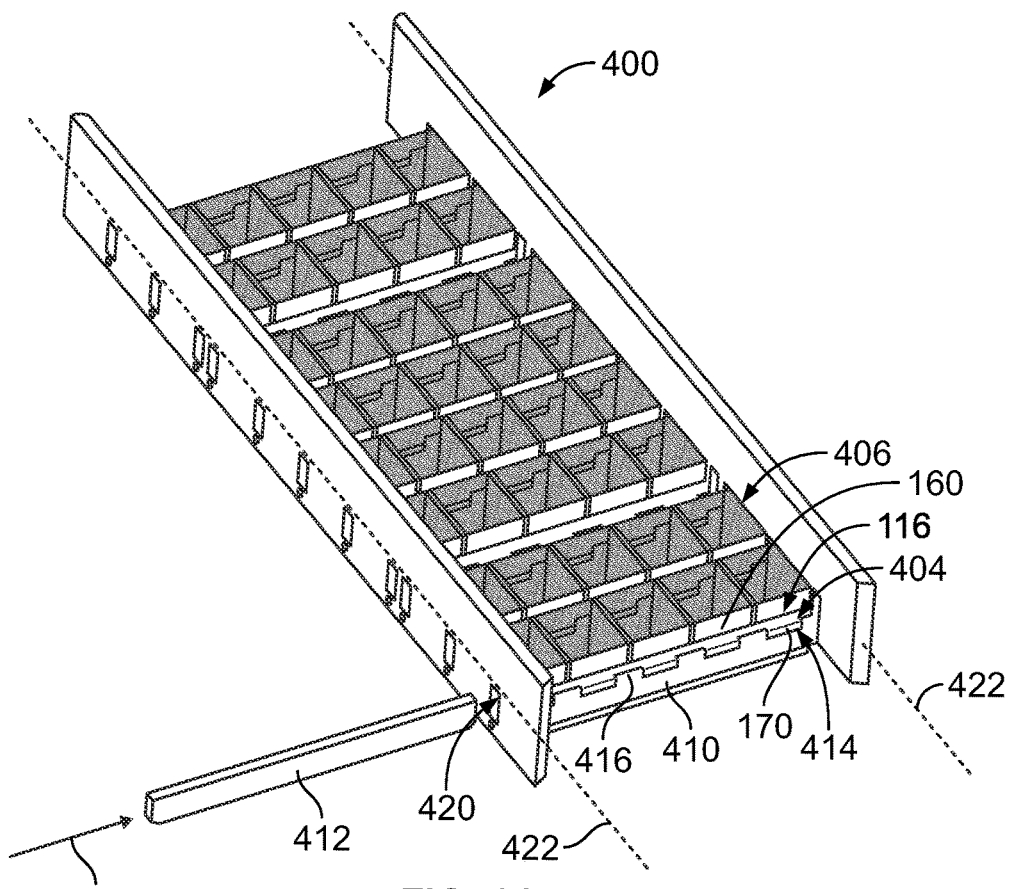
FIG. 14 is a partially assembled, rear perspective view of the cable connector grid frame shown in FIG. 12.

FIG. 14 is a partially assembled, rear perspective view of the cable connector grid frame 400 and corresponding cable connectors 116. The front rails 410 are positioned between the side rails 406 and may be secured thereto by fasteners, such as threaded fasteners. The cable connectors 116 are then loaded into the cable connector openings 404. The lugs 170 are received in corresponding notches 414 to position the headers 160 relative to the side rails 406 and front rails 410.

The side rails 406 include slots 420 spaced apart along side axes 422 of the side rails 406. The rear rails 412 are loaded through the slots 420 in a loading direction 424. As each rear rail 412 is loaded through the corresponding slot 420, the track 418 (shown in FIG. 13) receives the mounting ears 416. Once positioned, the rear rail 412 closes off the notches 414 and blocks the headers 160 from removal from the cable connector grid frame 400. Once assembled, the cable connector grid frame 400 may be loaded into a corresponding cable tray (not shown). The cable tray and cable connector grid frame 400 may then be coupled to a corresponding backplane (not shown).

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A cable backplane system comprising:
a backplane having connector openings receiving corresponding cable connectors therein;
a cable tray coupled to the backplane, the cable tray having side walls surrounding a cavity defining a raceway for cables interconnecting corresponding cable connectors; and
a cable connector grid frame supporting the cable connectors, the cable connector grid frame comprising side rails and center rails, the center rails being separate and discrete pieces from the side rails and being individually secured thereto to form the cable connector grid frame, the center rails being held between the side rails and forming a grid of cable connector openings between the side rails and the center rails, the cable connector openings receiving corresponding headers of the cable connectors and holding positions of the headers relative to one another, wherein the cable connector grid frame and the cable connectors are assembled to form a cable connector grid frame and cable connector assembly that is loaded into the cable tray to position the cable connectors and corresponding cables in the cable tray as a unit to form a cable tray assembly, wherein the cable tray assembly, including the cable tray, the cable connector grid frame and the cable connectors with the corresponding cables, is then coupled to the backplane as a unit with the cable connector grid frame holding the cable connectors in the cable tray and positioning each of the cable connectors relative to the backplane for alignment and receipt in the corresponding connector openings.

2. The cable backplane system of claim 1, wherein the cable connector grid frame holds mutually perpendicular X, Y, and Z positions of the headers with respect to one another.

3. The cable backplane system of claim 1, wherein the side rails hold multiple center rails defining multiple rows of cable connector openings, each row of cable connector openings holding a plurality of headers of cable connectors.

4. The cable backplane system of claim 1, wherein the cable connector grid frame comprises a rigid frame structure, the headers being loosely held in the cable connector openings such that the headers have a limited amount of floating movement in the cable connector openings relative to the rigid frame structure.

5. The cable backplane system of claim 1, wherein each header is captured between two center rails.

6. The cable backplane system of claim 1, wherein the center rails comprise notches, the headers comprising lugs extending therefrom, the lugs being received in corresponding notches, the notches being oversized relative to the lugs to allow the lugs to float within the notches to allow a limited amount of floating movement of the headers relative to the cable connector grid frame.

7. The cable backplane system of claim 6, wherein the center rails separate two rows of cable connector openings, the notches being sized to receive lugs from headers in both rows of cable connector openings.

8. The cable backplane system of claim 1, wherein the center rails are generally planar and extend along planes generally parallel to mating axes of the cable connectors, the center rails each comprise a front rail and a rear rail separate and discrete from each other and configured to be coupled to each other with the front rail being positioned forward of the rear rail along the mating axes, the headers comprising lugs extending therefrom, the lugs being captured between the corresponding front rail and rear rail.

9. The cable backplane system of claim 8, wherein the headers are coupled to the front rail prior to the rear rail being coupled to at least one of the front rail and the side rails, the headers being captured between the front rail and the rear rail.

10. The cable backplane system of claim 1, wherein the side rails extend along side axes, the side rails including slots spaced apart along the side axes of the side rails, the center rails received in corresponding slots to hold positions of the side rails along the side axes.

11. The cable backplane system of claim 1, wherein the center rails are secured to the side rails to fix positions of the center rails relative to the side rails.

12. The cable backplane system of claim 11, wherein the center rails are secured to the side rails by at least one of fasteners or clamps.

13. The cable backplane system of claim 11, wherein the center rails are secured to the side rails by tabs extending from the center rails.

14. A cable backplane system comprising:
a cable connector grid frame for supporting cable connectors, the cable connector grid frame comprising side rails and center rails, the center rails being separate and discrete pieces from the side rails and being individually held between the side rails to form a rigid frame structure, the side rails and the center rails being generally planar and extending along planes generally parallel to mating axes of the cable connectors, the cable connector grid frame comprising cable connector openings defined between the center rails, the cable connector openings configured to receive corresponding headers of the cable connectors, the center rails having notches formed therein configured to receive lugs of the headers to support the headers between the center rails to hold positions of the headers relative to one another, the notches being oversized relative to the lugs to allow a limited amount of floating movement of the headers in the cable connector openings relative to the rigid frame structure;

wherein the cable connector grid frame and the cable connectors are preassembled to a cable tray to form a cable tray assembly configured to be coupled to a backplane as a unit with the cable connector grid frame holding the cable connectors in the cable tray and positioning each of the cable connectors relative to the backplane for alignment of the cable connectors with the backplane.

15. The cable backplane system of claim 14, wherein the side rails hold multiple center rails defining multiple rows of cable connector openings, each row of cable connector openings holding a plurality of headers of cable connectors.

16. The cable backplane system of claim 14, wherein the center rails each comprise a front rail and a rear rail, the lugs being captured between the corresponding front rail and rear rail.

17. The cable backplane system of claim 16, wherein the headers are coupled to the front rail prior to the rear rail being coupled to at least one of the front rail and the side rails, the headers being captured between the front rail and the rear rail.

18. The cable backplane system of claim 14, wherein the side rails extend along side axes, the side rails including slots spaced apart along the side axes of the side rails, the center rails received in corresponding slots to hold positions of the side rails along the side axes.

19. The cable backplane system of claim 14, wherein the center rails are secured to the side rails to fix positions of the center rails relative to the side rails.

* * * * *